(12) United States Patent
Liu et al.

(10) Patent No.: US 11,663,846 B2
(45) Date of Patent: *May 30, 2023

(54) FINGERPRINT IDENTIFICATION APPARATUS AND ELECTRONIC DEVICE

(71) Applicant: SHENZHEN GOODIX TECHNOLOGY CO., LTD., Shenzhen (CN)

(72) Inventors: Kai Liu, Shenzhen (CN); Yiping Guo, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 245 days.

This patent is subject to a terminal disclaimer.

(21) Appl. No.: 17/344,066

(22) Filed: Jun. 10, 2021

(65) Prior Publication Data

US 2021/0303820 A1  Sep. 30, 2021

Related U.S. Application Data

(63) Continuation of application No. 16/693,242, filed on Nov. 23, 2019, now Pat. No. 11,062,117, which is a (Continued)

(51) Int. Cl.
*G06V 40/13* (2022.01)

(52) U.S. Cl.
CPC .......... *G06V 40/13* (2022.01); *G06V 40/1306* (2022.01); *G06V 40/1324* (2022.01); *H01L 2224/48227* (2013.01)

(58) Field of Classification Search
CPC ........ G06K 9/00006–0012; G06K 2009/0006; H01L 2224/485–48998;
(Continued)

(56) References Cited

U.S. PATENT DOCUMENTS

| 7,192,798 B2 * | 3/2007 | Okada ............... G06V 40/1306 257/680 |
| 9,001,081 B2 * | 4/2015 | Pope .................. G06V 40/1306 200/600 |

(Continued)

FOREIGN PATENT DOCUMENTS

| CN | 101478858 A | 7/2009 |
| CN | 104156712 A | 11/2014 |

(Continued)

OTHER PUBLICATIONS

Notice of Allowance dated Mar. 10, 2021 received in United States U.S. Appl. No. 16/693,242.

*Primary Examiner* — Patrick F Marinelli

(74) *Attorney, Agent, or Firm* — Scully, Scott, Murphy & Presser, P.C.

(57) ABSTRACT

Provided are a fingerprint identification apparatus and an electronic device. The fingerprint identification apparatus is applicable to an electronic device having a display screen, and includes: a fingerprint sensor chip; and a substrate, where an upper surface of the substrate extends downward to form a first groove, and at least a portion of the fingerprint sensor chip is disposed in the first groove and electrically connected to the substrate. By disposing at least a portion of the fingerprint identification sensor in the first groove, not only could costs and complexity of the electronic device be reduced, but also a thickness of the fingerprint identification apparatus could be effectively reduced.

16 Claims, 3 Drawing Sheets

Related U.S. Application Data continuation of application No. PCT/CN2019/089123, filed on May 29, 2019.

(58) Field of Classification Search
CPC .................... H01L 2224/49–49505; H01L 2224/47–48499; G06V 40/12–1394
See application file for complete search history.

(56) References Cited

U.S. PATENT DOCUMENTS

| | | | | |
|---|---|---|---|---|
| 9,030,440 | B2* | 5/2015 | Pope | G06V 40/1329 345/174 |
| 9,576,177 | B2* | 2/2017 | Lundahl | G06V 40/1329 |
| 9,639,224 | B2* | 5/2017 | Lee | G06V 40/1306 |
| 10,090,217 | B2* | 10/2018 | Wang | H01L 23/498 |
| 10,133,907 | B2* | 11/2018 | Wang | H01L 23/295 |
| 10,445,553 | B2* | 10/2019 | Lu | H01L 23/4985 |
| 10,445,554 | B2* | 10/2019 | Lu | H01L 24/73 |
| 10,565,425 | B2* | 2/2020 | Cai | H04M 1/026 |
| 10,784,298 | B2* | 9/2020 | Dong | G06V 40/12 |
| 11,138,407 | B2* | 10/2021 | Nie | G06F 3/0412 |
| 2003/0156743 | A1* | 8/2003 | Okada | G06V 40/1306 382/124 |
| 2006/0102974 | A1 | 5/2006 | Chen | |
| 2011/0096219 | A1* | 4/2011 | Lee | H01L 24/97 257/E31.127 |
| 2013/0307818 | A1* | 11/2013 | Pope | G06V 40/1318 345/174 |
| 2014/0216914 | A1* | 8/2014 | Pope | G06V 40/1365 200/600 |
| 2015/0163907 | A1* | 6/2015 | Chang | H05K 1/0259 29/841 |
| 2016/0049526 | A1* | 2/2016 | Oganesian | H01L 31/0203 257/434 |
| 2016/0171271 | A1* | 6/2016 | Lundahl | G06V 10/147 382/124 |
| 2017/0110416 | A1* | 4/2017 | Miao | H01L 23/49838 |
| 2017/0140195 | A1* | 5/2017 | Wang | H01L 24/24 |
| 2017/0287797 | A1* | 10/2017 | Wang | H01L 23/585 |
| 2017/0300736 | A1 | 10/2017 | Song et al. | |
| 2018/0108585 | A1* | 4/2018 | Wang | G06V 40/12 |
| 2018/0129848 | A1* | 5/2018 | Wang | H01L 23/293 |
| 2018/0211085 | A1 | 7/2018 | Liu et al. | |
| 2018/0336393 | A1* | 11/2018 | Lin | G06V 40/13 |
| 2018/0365470 | A1 | 12/2018 | Li et al. | |
| 2018/0365472 | A1* | 12/2018 | Cai | G06V 10/147 |
| 2019/0026533 | A1* | 1/2019 | Lu | H01L 23/08 |
| 2019/0057239 | A1* | 2/2019 | Hou | G06V 40/1324 |
| 2019/0065820 | A1* | 2/2019 | Lu | H01L 23/13 |
| 2019/0102598 | A1 | 4/2019 | Jiang | |
| 2019/0326339 | A1* | 10/2019 | Dong | H01L 27/14683 |
| 2020/0012835 | A1* | 1/2020 | Jiang | G06V 40/1318 |
| 2020/0117876 | A1* | 4/2020 | Cai | G02B 13/0025 |
| 2020/0218873 | A1* | 7/2020 | Guo | G06V 40/1318 |
| 2020/0218920 | A1* | 7/2020 | Guo | G06V 40/13 |
| 2020/0242323 | A1* | 7/2020 | Jiang | G02B 7/04 |
| 2020/0293741 | A1* | 9/2020 | Du | G06V 40/1329 |
| 2020/0302142 | A1* | 9/2020 | Liu | G06F 3/0412 |
| 2020/0348550 | A1* | 11/2020 | Wu | G06V 40/1318 |
| 2020/0380240 | A1* | 12/2020 | Liu | G06V 40/1324 |
| 2020/0395285 | A1* | 12/2020 | Dong | H01L 22/32 |
| 2020/0395402 | A1* | 12/2020 | Dong | G06V 40/1318 |
| 2021/0004558 | A1* | 1/2021 | Zeng | G06V 40/1318 |
| 2021/0064846 | A1* | 3/2021 | Nie | G06F 3/0412 |
| 2021/0303820 | A1* | 9/2021 | Liu | G06V 40/1324 |

FOREIGN PATENT DOCUMENTS

| | | |
|---|---|---|
| CN | 104517862 A | 4/2015 |
| CN | 107563348 A | 1/2018 |
| CN | 107820617 A | 3/2018 |
| CN | 207690104 U | 8/2018 |
| CN | 109075141 A | 12/2018 |
| CN | 109508607 A | 3/2019 |
| CN | 109716351 A | 5/2019 |
| CN | 109791610 A | 5/2019 |
| CN | 109791611 A | 5/2019 |
| CN | 208836251 U | 5/2019 |
| CN | 208908034 U | 5/2019 |
| CN | 209911987 U | 1/2020 |

* cited by examiner

FINGERPRINT IDENTIFICATION APPARATUS AND ELECTRONIC DEVICE

CROSS-REFERENCE TO RELATED APPLICATIONS

This application is a continuation of U.S. patent application Ser. No. 16/693,242, filed on Nov. 23, 2019, which is a continuation of international application No. PCT/CN2019/089123, filed on May 29, 2019. All of the aforementioned patent applications are hereby incorporated by reference in their entireties.

TECHNICAL FIELD

Embodiments of the present application relate to the electronic field, and more particularly, to a fingerprint identification apparatus and an electronic device.

BACKGROUND

An under-screen fingerprint identification solution refers to attaching an optical fingerprint identification module or an ultrasonic fingerprint identification module to a bottom of a light emitting layer of an organic light-emitting diode (OLED) screen, that is, either the optical fingerprint identification module or the ultrasonic fingerprint identification module is required to be closely adhered to the bottom of the light emitting layer.

However, since the OLED screen is costly and fragile, the OLED screen is easily damaged when the fingerprint identification module is directly attached to the OLED screen. In addition, since the fingerprint identification module and the OLED screen are completely adhered, if the fingerprint identification module is damaged, the OLED screen is easily damaged when the fingerprint identification module is disassembled. Moreover, an attaching process of directly attaching the fingerprint identification module to the OLED screen is also relatively complicated.

Due to the above problems, costs and complexity of an electronic device are greatly increased, and maintainability is low.

In addition, due to an excessive thickness of an existing fingerprint identification module, the market demand for ultra-thin electronic devices cannot be met.

SUMMARY

Embodiments of the present application provide a fingerprint identification apparatus and an electronic device, which could not only reduce costs and complexity of the electronic device, but also effectively reduce a thickness of the fingerprint identification apparatus.

In a first aspect, provided is a fingerprint identification apparatus that is applicable to an electronic device having a display screen, and includes:

a fingerprint sensor chip; and a substrate, where an upper surface of the substrate extends downward to form a first groove, and at least a portion of the fingerprint sensor chip is disposed in the first groove and electrically connected to the substrate;

where the fingerprint sensor chip is disposed under the display screen through the substrate, and configured to receive a fingerprint detecting signal returned by reflection or scattering via a human finger on the display screen and detect fingerprint information of the finger based on the fingerprint detecting signal.

At least a portion of the fingerprint sensor chip is disposed in the first groove, which could effectively reduce a thickness of the fingerprint identification apparatus, and the fingerprint sensor chip is disposed under the display screen through the substrate, which could avoid using an attaching adhesive to fixedly connect the fingerprint sensor chip with the display screen, and then could reduce costs and complexity of an electronic device. For example, the substrate is fixed to a middle frame of the electronic device.

In some possible implementation manners, a size of the first groove is greater than a size of the fingerprint sensor chip such that there is a gap between a side wall of the fingerprint sensor chip and a side wall of the first groove for accommodating a gold wire, and the gold wire is used to electrically connect the fingerprint sensor chip with the substrate.

The gap between the side wall of the fingerprint sensor chip and the side wall of the first groove can be used not only to accommodate the gold wire, but also to accommodate protection glue of the gold wire, and then conductivity of the gold wire and performance of the fingerprint identification apparatus are ensured.

In some possible implementation manners, a depth of the first groove includes a thickness of a covering film of the substrate and a thickness of a conducting layer located under the covering film.

In some possible implementation manners, the substrate includes at least two conducting layers.

In some possible implementation manners, the depth of the first groove includes a thickness of a first conducting layer located under the covering film, the fingerprint sensor chip is electrically connected to a second conducting layer under an insulating layer through a conductive through hole (for example, a through hole penetrating the insulating layer under the first conducting layer), and thus the fingerprint sensor chip can be electrically connected to the substrate.

In some possible implementation manners, the fingerprint identification apparatus further includes:

a support disposed above the substrate around the fingerprint sensor chip; and a first foam layer disposed above the support and provided with an opening penetrating the first foam layer, where the fingerprint sensor chip receives the fingerprint detecting signal returned by the reflection or scattering via the finger through the opening of the first foam layer.

In some possible implementation manners, a lower surface of the support is connected to the upper surface of the substrate by support fixing glue, and an upper surface of the support is connected to the first foam layer by a double-sided adhesive tape.

In some possible implementation manners, the support is a support formed of a double-sided adhesive tape for connecting the substrate with the first foam layer.

In some possible implementation manners, a side wall of the support that is close to the fingerprint sensor chip is aligned with a side wall of the first groove such that there is a gap between the support and the fingerprint sensor chip for accommodating a gold wire, and the gold wire is used to electrically connect the fingerprint sensor chip with the substrate.

The gap between the fingerprint sensor chip and the support can be used not only to accommodate the gold wire, but also to accommodate protection glue of the gold wire, and then conductivity of the gold wire and performance of the fingerprint identification apparatus are ensured.

In some possible implementation manners, a thickness of the support is 0.05 mm~0.1 mm.

In some possible implementation manners, the fingerprint sensor chip is fixed in the first groove by fingerprint sensor chip fixing glue.

In some possible implementation manners, the upper surface of the substrate is provided with a gold finger of the substrate that is formed at a side of the first groove.

In some possible implementation manners, a first step is formed by an upper surface of the gold finger of the substrate and the upper surface of the substrate, and a thickness of the first step includes a thickness of a conducting layer of the substrate that is located under a covering layer.

In some possible implementation manners, the upper surface of the substrate extends downward in a first area to form a second groove, a second step is formed by the upper surface of the substrate and an upper surface of the gold finger of the substrate in a second area, the first area is an area where a side of the gold finger of the substrate is close to the first groove, and the second area is an area where a side the gold finger of the substrate is away from the first groove.

In some possible implementation manners, a depth of the second groove includes a thickness of a covering layer of the substrate and a thickness of a conducting layer located under the covering layer, and a thickness of the second step is the thickness of the conducting layer of the substrate that is located under the covering layer.

In some possible implementation manners, the fingerprint identification apparatus further includes:

a flexible circuit board provided with a gold finger of the flexible circuit board; and an anisotropic conductive film, where the gold finger of the flexible circuit board is electrically connected to the gold finger of the substrate by the anisotropic conductive film.

The substrate and the flexible circuit board are electrically connected through the gold fingers, which could not only ensure insulativity between contacts, but also ensure conductivity between the substrate and the flexible circuit board. Particularly, in a case that the fingerprint sensor chip includes a plurality of chips, the plurality of chips on the substrate may be quickly electrically connected to the flexible circuit board through gold fingers, and then assembly complexity and disassembly complexity could be reduced.

In some possible implementation manners, the gold finger of the substrate and the gold finger of the flexible circuit board include a plurality of conductive contacts.

In some possible implementation manners, the plurality of conductive contacts are provided with a conductive protective layer.

In some possible implementation manners, a lower surface of the flexible circuit board extends upward in a third area to form a third groove, a third step is formed by the lower surface of the flexible circuit board and a lower surface of the gold finger of the flexible circuit board in a second area, the third area is an area where a side of the gold finger of the flexible circuit board is away from the first groove, and the second area is an area where a side of the gold finger of the flexible circuit board is close to the first groove.

In some possible implementation manners, the gold finger of the flexible circuit board is located at one end of the flexible circuit board.

In some possible implementation manners, the gold finger of the flexible circuit board is located at a middle position of the flexible circuit board, one end of the flexible circuit board is provided with an opening penetrating the flexible circuit board, and the opening of the flexible circuit board is aligned with an opening of the first groove such that the fingerprint sensor chip is disposed in the opening of the flexible circuit board.

In some possible implementation manners, a side wall of the flexible circuit board that is close to the fingerprint sensor chip is aligned with a side wall of the first groove such that there is a gap between the flexible circuit board and the fingerprint sensor chip for accommodating a gold wire, and the gold wire is used to electrically connect the fingerprint sensor chip with the substrate.

The gap between the flexible circuit board and the fingerprint sensor chip can be used not only to accommodate the gold wire, but also to accommodate protection glue of the gold wire, and then conductivity of the gold wire and performance of the fingerprint identification apparatus are ensured.

In some possible implementation manners, the substrate is a rigid circuit board portion of a rigid and flexible circuit board.

In some possible implementation manners, a depth of the first groove includes a thickness of a covering film of the substrate and a thickness of at least two conducting layers located under the covering film.

In some possible implementation manners, the fingerprint identification apparatus further includes:

a gold wire, where the fingerprint sensor chip is electrically connected to the substrate through the gold wire; and gold wire protection glue for encapsulating the gold wire.

In some possible implementation manners, an arc height or an encapsulation height of the gold wire is less than 150 μm.

In some possible implementation manners, the fingerprint identification apparatus further includes:

an optical path layer disposed above the fingerprint sensor chip and configured to transmit the fingerprint detecting signal returned by the reflection or scattering via the finger to the fingerprint sensor chip.

In some possible implementation manners, the optical path layer includes a micro lens layer and a light blocking layer, the micro lens layer has a micro lens array formed by a plurality of micro lenses, the light blocking layer has a plurality of micro holes and is disposed under the micro lens layer, and the micro holes are in one-to-one correspondence with the micro lenses.

In some possible implementation manners, the optical path layer further includes a filter, and the filter is disposed above the micro lens layer or disposed in an optical path between the micro lens layer and the fingerprint sensor chip.

In some possible implementation manners, the fingerprint sensor chip includes a plurality of optical fingerprint sensor chips, and the plurality of optical fingerprint sensor chips are arranged side by side in the first groove to be spliced into an optical fingerprint sensor chip assembly.

In some possible implementation manners, the fingerprint identification apparatus further includes:

an image processor electrically connected to the substrate.

In some possible implementation manners, the fingerprint identification apparatus further includes:

at least one capacitor electrically connected to the substrate and configured to optimize the fingerprint detecting signal acquired by the fingerprint sensor chip.

In some possible implementation manners, the fingerprint identification apparatus further includes:

a connector electrically connected to the substrate and configured to connect an external apparatus or another component of the electronic device.

In some possible implementation manners, a distance between a lower surface of a light emitting layer of the display screen and an upper surface of the fingerprint sensor chip is less than 600 μm.

In some possible implementation manners, a thickness of the substrate ranges from 0.1 mm to 0.4 mm.

A second foam layer is disposed under the display screen, the second foam layer is provided with a hole penetrating the second foam layer, and the fingerprint sensor chip is disposed under the hole of the second foam layer.

In some possible implementation manners, a middle frame of the electronic device is provided with a fourth groove, and at least a portion of the substrate is disposed in the fourth groove.

In a second aspect, provided is an electronic device, including:

a display screen; and a fingerprint identification apparatus disposed under the display screen, where the fingerprint identification apparatus is the fingerprint identification apparatus according to the first aspect or any one of possible implementation manners of the first aspect, and a fingerprint capturing area of the fingerprint identification apparatus is at least partially located in a display area of the display screen.

In some possible implementation manners, the electronic device further includes:

a second foam layer disposed under the display screen and provided with a hole penetrating the second foam layer, where the fingerprint sensor chip is disposed under the hole of the second foam layer.

In some possible implementation manners, the electronic device further includes:

a middle frame provided with a fourth groove, where at least a portion of the fingerprint identification apparatus is disposed in the fourth groove.

Based on the above technical solutions, the fingerprint identification apparatus and the electronic device according to the embodiments of the present application could not only reduce costs and complexity of the electronic device, but also effectively reduce a thickness of the fingerprint identification apparatus.

DESCRIPTION OF EMBODIMENTS

The technical solutions in embodiments of the present application will be described hereinafter with reference to the accompanying drawings.

The technical solutions of the embodiments of the present application may be applied to various electronic devices. For example, portable or mobile computing devices such as smartphones, laptops, tablets and gaming devices, and other electronic devices such as electronic databases, automobiles and bank automated teller machines (ATM), which are not limited in the embodiments of the present application.

The technical solutions of the embodiments of the present application may be applied to a biometric identification technology. The biometric identification technology includes, but is not limited to, identification technologies, such as fingerprint identification, palm print identification, iris identification, human face identification and living body identification. For convenience of illustration, a fingerprint identification technology is described below as an example.

The technical solutions of the embodiments of the present application may be used for an under-screen fingerprint identification technology and an in-screen fingerprint identification technology.

The under-screen fingerprint identification technology refers to mounting a fingerprint identification module under a display screen, so as to realize a fingerprint identification operation in a display area of the display screen without setting a fingerprint capturing area in an area other than the display area on a front face of an electronic device. Specifically, the fingerprint identification module uses light returned from a top surface of a display component of the electronic device for fingerprint sensing and other sensing operations. This returned light carries information about an object (for example, a finger) that is in contact with or near the top surface of the display component, and the fingerprint identification module located under the display component implements under-screen fingerprint identification by acquiring and detecting this returned light. The fingerprint identification module may be designed to achieve desired optical imaging by properly configuring an optical element for acquiring and detecting a returned light, so that fingerprint information of the finger is detected.

Correspondingly, the in-screen (In-display) fingerprint identification technology refers to mounting a fingerprint identification module or a part of a fingerprint identification module inside a display screen, so as to realize a fingerprint identification operation in a display area of the display screen without setting a fingerprint capturing area in an area other than the display area on the front face of an electronic device.

Figure 1:
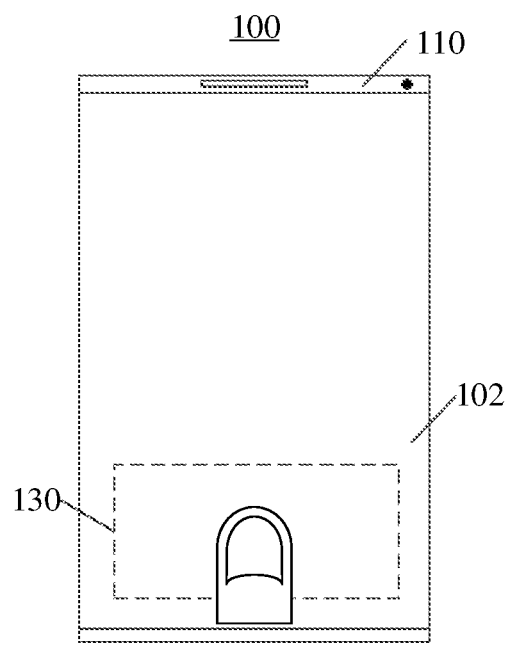
FIG. 1 is a schematic plan view of an electronic device applicable to the present application.
Figure 2:
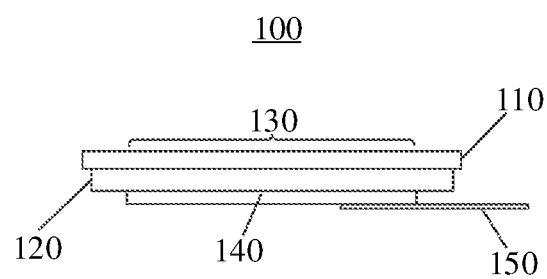
FIG. 2 is a schematic side cross-sectional view of the electronic device shown in FIG. 1.

FIGS. 1 and 2 are schematic views showing an electronic device 100 applicable to an under-screen fingerprint identification technology. FIG. 1 is a schematic front view of an electronic device 100, and FIG. 2 is a schematic partial cross-sectional structural view of the electronic device 100 shown in FIG. 1.

As shown in FIG. 1 and FIG. 2, the electronic device 100 may include a display screen 120 and a fingerprint identification module 140.

The display screen 120 may be a self-emitting display screen that adopts a self-emitting display unit as a display pixel. For example, the display screen 120 may be an organic light-emitting diode (OLED) display screen or a micro light-emitting diode (micro-LED) display screen. In other alternative embodiments, the display screen 120 may also be a liquid crystal display (LCD) screen or another passive light-emitting display screen, which is not limited in the embodiments of the present application.

In addition, the display screen 120 may specifically be a touch display screen, which may not only display an image, but also detect a touch or press operation of a user, thereby providing the user with a human-machine interaction interface. For example, in an embodiment, the electronic device 100 may include a touch sensor, and the touch sensor may specifically be a touch panel (TP), which may be disposed on a surface of the display screen 120, or may be partially integrated or entirely integrated into an interior of the display screen 120 to form the touch display screen.

The fingerprint identification module 140 may be an optical fingerprint identification module, for example, including an optical fingerprint sensor.

Specifically, the fingerprint identification module 140 may include a sensor chip (hereinafter also referred to as an optical fingerprint sensor) having an optical sensing array. The optical sensing array includes a plurality of optical sensing units, and each of the optical sensing units may specifically include a photo detector or a photoelectric sensor. In other words, the fingerprint identification module 140 may include a photo detector array (or referred to as a photoelectric detector array, a photoelectric sensor array) including a plurality of photo detectors distributed in an array.

As shown in FIG. 1, the fingerprint identification module 140 may be disposed in a partial area under the display screen 120 such that a fingerprint capturing area (or detecting area) 130 of the fingerprint identification module 140 is at least partially located in a display area 102 of the display screen 120.

Certainly, in other alternative embodiments, the fingerprint identification module 140 may also be disposed at another position, such as a side of the display screen 120 or a non-light transmissive area of an edge of the electronic device 100. In this case, an optical signal from at least part of the display area of the display screen 120 may be guided to the fingerprint identification module 140 by using an optical path design, so that the fingerprint capturing area 130 is actually located in the display area of the display screen 120.

In some embodiments of the present application, the fingerprint identification module 140 may include only one sensor chip, and in this case, the fingerprint capturing area 130 of the fingerprint identification module 140 has a smaller area and a fixed position, therefore, when performing fingerprint inputting, a user needs to press a finger at a specific position of the fingerprint capturing area 130, otherwise the fingerprint identification module 140 may not be able to capture a fingerprint image, thereby resulting in poor user experience.

In other embodiments of the present application, the fingerprint identification module 140 may specifically include a plurality of sensor chips; the plurality of sensor chips may be disposed under the display screen 120 side by side by means of splicing, and sensing areas of the plurality of sensor chips collectively form the fingerprint capturing area 130 of the fingerprint identification module 140. That is, the fingerprint capturing area 130 of the fingerprint identification module 140 may include a plurality of sub-areas, and each sub-area corresponds to the sensing area of one of the sensor chips, so that the fingerprint capturing area 130 of the fingerprint identification module 140 may be extended to a main area of a lower half of the display screen, that is, to an area against which the finger is usually pressed, thereby achieving a blind pressing type of a fingerprint input operation. Alternatively, when the number of sensor chips is sufficient, the fingerprint detecting area 130 may further be extended to a half of the display area or even the entire display area, thereby achieving half-screen or full-screen fingerprint detection.

It should be understood that the specific form of the plurality of sensor chips is not limited in the embodiment of the present application.

For example, the plurality of sensor chips may be individually encapsulated sensor chips, or may be a plurality of dies (Die) encapsulated in a same chip capsule.

For another example, the plurality of sensor chips may also be fabricated and formed in different areas of a same chip by a semiconductor process.

As shown in FIG. 2, an area where the optical sensing array of the fingerprint identification module 140 is located or a light sensing range of the optical sensing array of the fingerprint identification module 140 corresponds to the fingerprint capturing area 130 of the fingerprint identification module 140. An area of the fingerprint capturing area 130 of the fingerprint identification module 140 may be equal to or not equal to an area of the area where the optical sensing array of the fingerprint identification module 140 is located or the optical sensing range of the optical sensing array of the fingerprint identification module 140, which is not specifically limited in the embodiment of the present application.

For example, by an optical path design of light collimation, the area of the fingerprint capturing area 130 of the fingerprint identification module 140 may be designed to be substantially consistent with an area of the sensing array of the fingerprint identification module 140.

For another example, by an optical path design of converging light or an optical path design of reflecting light by a macro lens, the area of the fingerprint capturing area 130 of the fingerprint identification module 140 may be larger than an area of the sensing array of the fingerprint identification module 140.

An optical path design of the fingerprint identification module 140 is exemplarily described below.

In an example that the optical path design of the fingerprint identification module 140 adopts an optical collimator having an array of through holes with a high aspect ratio, the optical collimator may specifically be a collimator layer fabricated on a semiconductor silicon wafer, which has a plurality of collimating units or micro holes, and a collimating unit may specifically be a small hole. Light in reflected light reflected back from a finger that is vertically incident to the collimating unit may pass through the collimating unit and be received by a sensor chip under the collimating unit. However, light with an excessive large incident angle is attenuated through multiple reflection inside the collimating unit, therefore, each sensor chip may basically only receive reflected light reflected back from a fingerprint pattern right above the sensor chip, which could effectively improve image resolution and then improve a fingerprint identification effect.

Further, when the fingerprint identification module 140 includes a plurality of sensor chips, one collimating unit may be configured for one optical sensing unit in an optical sensing array of each sensor chip, and is disposed above a corresponding optical sensing unit by means of attachment. Of course, the plurality of optical sensing units may also share one collimating unit, that is, the one collimating unit has a sufficiently large aperture to cover the plurality of optical sensing units. Since one collimating unit may correspond to the plurality of optical sensing units and a correspondence between a spatial period of the display screen 120 and a spatial period of the sensor chips is broken, even if a spatial structure of a light emitting display array of the display screen 120 and a spatial structure of the optical sensing array of the sensor chip are similar, it could be effectively avoided that the fingerprint identification module 140 uses an optical signal passing through the display screen 120 to perform fingerprint imaging to generate Moire fringes, and the fingerprint identification effect of the fingerprint identification module 140 is effectively improved.

In an example that the optical path design of the fingerprint identification module 140 adopts an optical path design of an optical lens, the optical lens may include an optical lens layer having one or more lens units, for example, a lens group composed of one or more aspheric lenses, for converging reflected light reflected back from a finger to the sensing array of the sensor chip under the optical lens layer, so that the sensing array may perform imaging based on the reflected light so as to obtain an fingerprint image of the finger.

The optical lens layer may further be provided with a pinhole or a micro hole diaphragm formed in an optical path of the lens unit. For example, one or more light shielding sheets may be provided in the optical path of the lens unit, where at least one light shielding sheet may be provided with a light-transmitting micro hole formed in an optical axis or an optical center area of the lens unit, and the light-transmitting micro hole may serve as the foregoing pinhole or micro hole diaphragm. The pinhole or micro hole diaphragm may cooperate with the optical lens layer and/or another optical film layers above the optical lens layer and expand the field of view of the fingerprint identification module 140 to improve the fingerprint imaging effect of the fingerprint identification module 140.

Further, when the fingerprint identification module 140 includes a plurality of sensor chips, one optical lens may be configured for each of the sensor chips for fingerprint imaging, or one optical lens may be configured for the plurality of sensor chips to realize light convergence and fingerprint imaging. Even when one sensor chip has dual sensing arrays (Dual-Array) or multiple sensing arrays (Multi-Array), two or more optical lenses may be configured for this sensor chip to cooperate with the dual sensing arrays or the multiple sensing arrays for optical imaging, so as to reduce an imaging distance and enhance the imaging effect.

In an example that the optical path design of the fingerprint identification module 140 adopts an optical path design of a micro lens (Micro-Lens) layer, the micro lens layer may have a micro lens array formed by a plurality of micro lenses, which may be provided above the sensing array of the sensor chip by a semiconductor growth process or other processes, and each micro lens may correspond to one of the sensing units in the sensing array. Another optical film layer such as a dielectric layer or a passivation layer may be provided between the micro lens layer and the sensing units, and more specifically, a light blocking layer having a plurality of micro holes may also be provided between the micro lens layer and the sensing units, where a micro hole is provided between a corresponding micro lens and a corresponding sensing unit, and the light blocking layer may block optical interference between adjacent micro lenses and sensing units such that light is converged to an interior of the micro hole through the micro lens and transmitted to a sensing unit corresponding to the micro lens via the micro hole to perform optical fingerprint imaging.

Optionally, a filter may further be disposed above the micro lens layer or in an optical path between the micro lens layer and the sensor chip.

As an optional embodiment, the filter may be disposed above the micro lens layer, for example, the filter may be connected with the micro lens layer by a cushion layer, and the cushion layer may be a transparent dielectric layer and may be used to fill up a surface of the micro lens layer; or the filter may be fixed above the micro lens layer by a fixing apparatus, for example, a sealant or another support member is disposed in a non-photosensitive area around the micro lens layer to support and fix the filter.

As an optional embodiment, the filter may further be disposed in the optical path between the micro lens layer and the sensor chip. For example, the filter may be disposed above the sensor chip, and specifically, the filter may be fixed above the sensor chip by a fixing apparatus. For example, a sealant or another support member is disposed in a non-photosensitive area of the sensor chip to support and fix the filter, and an evaporation process or a sputtering process may also be applied to coat a film on the sensor chip to form the filter, that is, the filter is integrated with the sensor chip. It can be understood that the filter may also be to coat a film on another optical film layer, which is not limited herein.

It should be understood that the forgoing several implementations of an optical path directing structure may be used alone or in combination, for example, a micro lens layer may be further disposed under the collimator layer or the optical lens layer. Certainly, when the collimator layer or the optical lens layer is used in combination with the micro lens layer, the specific laminated structure or optical path may require to be adjusted according to actual needs.

The fingerprint identification module 140 may be used for capturing fingerprint information (such as fingerprint image information) of a user.

In an example that the display screen 120 adopts an OLED display screen, the display screen 120 may adopt a display screen with a self-emitting display unit, for example, an organic light-emitting diode (OLED) display screen or a micro light-emitting diode (Micro-LED) display screen. The fingerprint identification module 140 may use a display unit (that is, an OLED light source) of the OLED display screen that is located in the fingerprint capturing area 130 as an excitation light source for optical fingerprint detection.

When a finger touches, presses or approaches (collectively referred to as pressing for convenience of description) the fingerprint capturing area 130, the display screen 120 emits a beam of light to a finger above the fingerprint capturing area 130, and the beam of light is reflected by a surface of the finger to form reflected light or is scattered inside the finger to form scattered light. In related patent applications, the foregoing reflected light and scattered light are collectively referred to as reflected light for convenience of description. Since a ridge and a valley of a fingerprint have different light reflecting capabilities, reflected light from the ridge of the fingerprint and the reflected light from the valley of the fingerprint have different light intensities. After passing through the display screen 120, the reflected light is received by the sensor chip in the fingerprint identification module 140 and converted into a corresponding electrical signal, that is, a fingerprint detecting signal; and fingerprint image data may be obtained based on the fingerprint detecting signal, and fingerprint matching verification may be further performed, thereby implementing an optical fingerprint identification function at the electronic device 100.

Therefore, when a user needs to perform fingerprint unlocking or other fingerprint verification on the electronic device 100, an input operation of fingerprint characteristics can be implemented merely by pressing a finger on the fingerprint capturing area 130 in the display screen 120. Since capturing of the fingerprint characteristics can be implemented inside the display area 102 of the display screen 120, a front face of the electronic device 100 in the above structure does not need to specially reserve space to set a fingerprint button (such as a Home button), so that it is possible that a full screen solution can be adopted. Therefore, the display area 102 of the display screen 120 could be substantially extended to the whole front face of the electronic device 100.

Certainly, in other alternative solutions, the fingerprint identification module 140 may also provide an optical signal for fingerprint detection and identification by adopting an internal light source or an external light source. In this case, the fingerprint identification module 140 can not only apply to a self-emitting display screen such as an OLED display screen, but also apply to a non-self-emitting display screen such as a liquid crystal display screen or another passive light-emitting display screen.

In an example of a liquid crystal display screen having a backlight module and a liquid crystal panel, in order to support under-screen fingerprint detection of the liquid crystal display screen, an optical fingerprint system of the electronic device 100 may further include an excitation light source for optical fingerprint detection. The excitation light source may specifically be an infrared light source or a light source of non-visible light at a specific wavelength, which may be disposed under the backlight module of the liquid crystal display screen or disposed in an edge area under a protective cover of the electronic device 100. The fingerprint identification module 140 may be disposed under the liquid crystal panel or the edge area of the protective cover, and by being directed over an optical path, light for fingerprint detection may reach the fingerprint identification module 140. Alternatively, the fingerprint identification module 140 may also be disposed under the backlight module, and the backlight module allows the light for fingerprint detection to pass through the liquid crystal panel and the backlight module and reach the fingerprint identification module 140 by providing a hole on film layers such as a diffusion sheet, a brightening sheet, a reflection sheet or the like, or by performing other optical designs. When the fingerprint identification module 140 provides an optical signal for fingerprint detection by adopting an internal light source or an external light source, a detection principle may be the same.

As shown in FIG. 1, the electronic device 100 may further include a protective cover 110.

The cover 110 may specifically be a transparent cover such as a glass cover or a sapphire cover which is located on the display screen 120 and covers a front face of the electronic device 100, and a surface of the cover 110 may also be provided with a protective layer. Therefore, in an embodiment of the present application, the so-called finger being pressed against the display screen 120 may actually refer to the finger being pressed against the cover 110 on the display screen 120 or a surface of the protective layer covering the cover 110.

As shown in FIG. 1, a circuit board 150 such as a flexible circuit board (Flexible Printed Circuit, FPC) may also be disposed under the fingerprint identification module 140.

The fingerprint identification module 140 may be soldered to the circuit board 150 through a pad, and achieve electrical interconnection and signal transmission with other peripheral circuits or other elements of the electronic device 100 through the circuit board 150. For example, the fingerprint identification module 140 may receive a control signal from a processing unit of the electronic device 100 through the circuit board 150, and may also output the fingerprint detecting signal from the fingerprint identification module 140 to the processing unit, a control unit or the like of the electronic device 100 through the circuit board 150.

Figure 3:
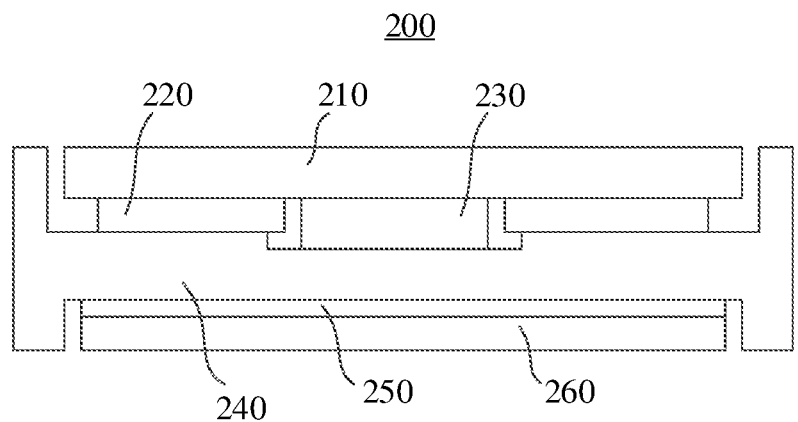
FIG. 3 is a schematic structural view of an electronic device having a fingerprint identification module according to an embodiment of the present application.

FIG. 3 is a schematic structural view of an electronic device having a fingerprint identification apparatus according to an embodiment of the present application.

As shown in FIG. 3, an electronic device 200 may include a display screen 210, a second foam layer 220, a fingerprint identification apparatus 230, a middle frame 240, battery fixing glue 250, and a battery 260. The display screen 210 may be the display screen shown in FIG. 1 and FIG. 2. For related description, reference may be made to the foregoing description of the display screen 120. The fingerprint identification apparatus 230 may be the fingerprint identification module shown in FIG. 1 and FIG. 2. For related functions, reference may be made to the foregoing related description of the fingerprint identification module 140, and no further details are provided herein. It should be understood that, in other alternative embodiments, the display screen 210 and the second foam layer 220 may also be collectively referred to as a display screen, and the display screen 210 may also be referred to as a light emitting layer of the display screen, which is not specifically limited in this embodiment of the present application.

With reference to FIG. 3, an upper surface of the middle frame 240 extends downward to form a fourth groove, that is, the middle frame 240 is provided with a fourth groove, and at least a portion of the fingerprint identification apparatus 230 is disposed in the fourth groove. Further, the second foam layer 220 may be provided with an opening penetrating the second foam layer 220, and at least a portion of the fingerprint identification apparatus 230 is disposed in the opening of the second foam layer 220. For example, a lower surface of the fingerprint identification apparatus 230 may be attached to a lower surface of the display screen 210. For another example, an upper surface of the fingerprint identification apparatus 230 may be attached to a bottom of the groove of the middle frame 240. For another example, an upper surface and a lower surface of the fingerprint identification apparatus 230 may be respectively attached to a lower surface of the display screen 210 and a bottom of the groove of the middle frame 240.

However, since the display screen 210 is costly and fragile, the display screen 210 is easily damaged when the fingerprint identification module 230 is directly attached to the display screen 210. In addition, since the fingerprint identification module 230 and the display screen 210 are completely adhered, if the fingerprint identification module 230 is damaged, the display screen 210 is easily damaged when the fingerprint identification module 230 is disassembled. Moreover, an attaching process of directly attaching the fingerprint identification module 230 to the display screen 210 is also relatively complicated. Due to the above problems, costs and complexity of the electronic device 200 are greatly increased, and maintainability is low.

The present application provides a fingerprint identification apparatus, which could reduce the costs and the complexity of the electronic device 200 and improve the maintainability.

Hereinafter, the fingerprint identification apparatus 230 according to the embodiment of the present application will be described in detail with reference to FIGS. 4 to 7.

It should be noted that, for convenience of description, in the embodiments of the present application, same reference numerals are used to represent same components, and detailed description of the same components is omitted in different embodiments for the sake of brevity.

Figure 4:
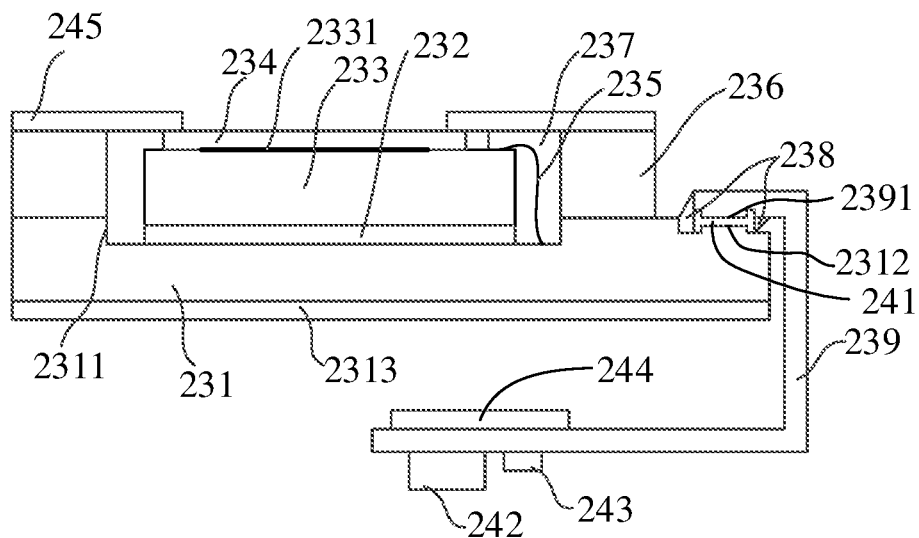
FIGS. 4 to 7 are schematic structural views of a fingerprint identification module according to an embodiment of the present application.

With reference to FIG. 4, the fingerprint identification apparatus 230 may include a fingerprint sensor chip 233 and a substrate 231, an upper surface of the substrate 231 extends downward to form a first groove 2311, and at least a portion of the fingerprint sensor chip 233 is disposed in the first groove 2311 and electrically connected to the substrate 231. For example, a lower surface of the fingerprint sensor chip 233 is fixedly connected to a bottom of the first groove 2311 and electrically connected to the substrate 231 through a gold wire 235. The fingerprint sensor chip 233 is disposed under the display screen 210 through the substrate 231, and configured to receive a fingerprint detecting signal returned by reflection or scattering via a human finger on the display screen 210 and detect fingerprint information of the finger based on the fingerprint detecting signal.

By disposing at least a portion of the fingerprint sensor chip 233 in the first groove 2311, a thickness of the fingerprint identification apparatus 230 could be effectively reduced; and the fingerprint sensor chip 233 is disposed under the display screen 210 through the substrate 231, which could avoid using an attaching adhesive to fixedly connect the fingerprint sensor chip 233 with the display screen 210, and then could reduce the costs and the complexity of the electronic device 200. For example, the substrate 231 is fixed to the middle frame 240 of the electronic device.

In some embodiments, the fingerprint sensor chip 233 may include a plurality of chips or may include one chip. For example, the fingerprint sensor chip 233 may include a plurality of optical fingerprint sensor chips, and the plurality of optical fingerprint sensor chips are arranged side by side in the first groove to be spliced into an optical fingerprint sensor chip assembly. The optical fingerprint sensor chip assembly may be configured to acquire a plurality of fingerprint images simultaneously, and the plurality of fingerprint images may be used as a fingerprint image for fingerprint identification after being spliced. With reference to FIG. 4, the fingerprint sensor chip 233 may be a sensor chip (hereinafter also referred to as an optical fingerprint sensor) having an optical sensing array 2331. The optical sensing array 2331 may include a plurality of optical sensing units, and each of the optical sensing units may specifically include a photo detector or a photoelectric sensor. In other words, the fingerprint sensor chip 233 may include a photo detector array (or referred to as a photoelectric detector array, a photoelectric sensor array) including a plurality of photo detectors distributed in an array.

With reference to FIG. 4, a size of the first groove 2311 may be greater than a size of the fingerprint sensor chip 233 such that there is a gap between a side wall of the fingerprint sensor chip 233 and a side wall of the first groove 2311 for accommodating the gold wire 235, and the gold wire 235 is used to electrically connect the fingerprint sensor chip 233 with the substrate 231. In addition, the size of the first groove 2311 is greater than the size of the fingerprint sensor chip 233, which could reduce assembly complexity and disassembly complexity of the fingerprint sensor chip 233.

A depth of the first groove 2311 may include a thickness of a covering film of the substrate 231 and a thickness of a conducting layer located under the covering film. The covering film of the substrate 231 may be an insulating layer for protecting and insulating the conducting layer under the covering film. The conducting layer located under the covering film is a circuit layer or a wiring layer of the substrate 231, and the fingerprint sensor chip 233 may achieve an electrical connection with an external device through the circuit layer or the wiring layer of the substrate.

For example, the substrate 231 may include at least two conducting layers. In this case, the depth of the first groove 2311 includes a thickness of a first conducting layer located under the covering film of the substrate 231, the fingerprint sensor chip 233 may be electrically connected to a second conducting layer under an insulating layer through a conductive through hole (for example, a through hole penetrating the insulating layer under the first conducting layer), and thus the fingerprint sensor chip 233 can be electrically connected to the substrate 231.

With reference to FIG. 4, the fingerprint sensor chip 233 may be fixed in the first groove 2311 by fixing glue 232 for the fingerprint sensor chip 233.

It should be understood that the fingerprint sensor chip 233 may also be fixedly connected to a side wall of the first groove 2311, or may be fixed in the first groove 2311 by another means. For example, the fingerprint sensor chip 233 may be fixed in the first groove 2311 by a buckle or a screw, which is not specifically limited in this embodiment.

With reference to FIG. 4, a lower surface of the substrate 231 may further be provided with a double-sided adhesive tape 2313 so as to bond the substrate 231 to a bottom of the groove of the middle frame 240 of the electronic device 200.

It should be understood that the substrate 231 may also be fixedly connected to a side wall of the groove of the middle frame 240, or the substrate 231 may be fixedly disposed in the groove of the middle frame 240 by another means (such as a buckle or a screw), which is not specifically limited in this embodiment of the present application.

With reference to FIG. 4, the upper surface of the substrate 231 may be provided with a gold finger 2312 of the substrate 231 formed at a side of the first groove 2311. In other words, the upper surface of the substrate 231 may be provided with a convex structure of the conducting layer of the substrate 231 formed at a side of the first groove 2311 to form the gold finger 2312 of the substrate 231.

It should be understood that the specific structure of the gold finger 2312 of the substrate 231 is not specifically limited in the present application. As an example, as shown in FIG. 4, the upper surface of the substrate 231 extends downward in a first area to form a second groove, a second step is formed by the upper surface of the substrate 231 and an upper surface of the gold finger of the substrate 231 in a second area, the first area is an area where a side of the gold finger of the substrate 231 is close to the first groove 2311, and the second area is an area where a side the gold finger of the substrate 231 is away from the first groove 2311. Further, a depth of the second groove may include a thickness of a covering layer of the substrate 231 and a thickness of a conducting layer located under the covering layer, and a thickness of the second step is the thickness of the conducting layer of the substrate 231 that is located under the covering layer such that a portion of the conducting layer of the substrate 231 forms a convex structure with a convex surface facing upward, and then the gold finger 2312 of the substrate 231 is formed.

With reference to FIG. 4, the fingerprint identification apparatus 230 may further include a flexible circuit board 239 and an anisotropic conductive film 241. The flexible circuit board 239 is provided with a gold finger 2391 of the flexible circuit board 239; and the gold finger 2391 of the flexible circuit board 239 is electrically connected to the gold finger 2312 of the substrate 231 by the anisotropic conductive film 241.

For example, the gold finger 2391 of the flexible circuit board 239 may be located at one end of the flexible circuit board 239. That is, one end of the flexible circuit board 239 may be electrically connected to one end of the substrate 231 by compressing the anisotropic conductive film 241.

The substrate 231 and the flexible circuit board 239 are electrically connected through the gold fingers, which could not only ensure insulativity between contacts, but also ensure conductivity between the substrate 231 and the flexible circuit board 239. Particularly, in a case that the fingerprint sensor chip 233 includes a plurality of chips, the plurality of chips on the substrate 231 may be quickly electrically connected to the flexible circuit board 239 through gold fingers, and then assembly complexity and disassembly complexity could be reduced.

It should be understood that the specific structure of the gold finger 2391 of the flexible circuit board 239 is not specifically limited in the present application. As an example, as shown in FIG. 4, a lower surface of the flexible circuit board 239 may extend upward in a third area to form a third groove, a third step may be formed by the lower surface of the flexible circuit board 239 and a lower surface of the gold finger of the flexible circuit board 239 in a fourth area, the third area is an area where a side of the gold finger 2391 of the flexible circuit board 239 is away from the first groove 2311, and the fourth area is an area where a side of the gold finger 2391 of the flexible circuit board 239 is close to the first groove 2311.

With reference to FIG. 4, the fingerprint identification apparatus 230 may further include protection glue 238 for the anisotropic conductive film 241, the protection glue 238 may be provided at both ends of the anisotropic conductive film 241 to protect the anisotropic conductive film 241, and further protect the gold finger 2312 of the substrate 231 and the gold finger 2391 of the flexible circuit board 239.

With reference to FIG. 4, the fingerprint identification apparatus 230 may further include a support 236 and a first foam layer 245, the first foam layer 245 is disposed above the support 236 and provided with an opening penetrating the first foam layer 245, and the fingerprint sensor chip 233 may receive the fingerprint detecting signal returned by the reflection or scattering via the finger through the opening of the first foam layer 245.

In combination with FIG. 3, the first foam layer 245 may be a foam layer of the fingerprint identification apparatus 230, or may be a foam layer of the electronic device 200 that is located between the display screen 210 and the middle frame 240, which is not specifically limited in the present application. In other words, when the first foam layer 245 is a foam layer of the fingerprint identification apparatus 230, the first foam layer 245 may be in direct contact with the display screen 210, and further the first foam layer 245 may be in a state of compression; and when the first foam layer 245 is a foam layer of the electronic device 200 that is located between the display screen 210 and the middle frame 240, it is illustrated that the fingerprint identification apparatus 230 is directly attached to a lower surface of the second foam layer 220 under the display screen 210.

It should be understood that the support 236 may be formed of any material that can be used to fixedly connect the substrate 231 with the first foam layer 245. For example, the support 236 may be a support formed of a double-sided adhesive tape.

With reference to FIG. 4, a side wall of the support 236 that is close to the fingerprint sensor chip 233 may be aligned with a side wall of the first groove 2311 such that there is a gap between the support 236 and the fingerprint sensor chip 233 for accommodating the gold wire 235.

The gap between the support 236 and the fingerprint sensor chip 233 can be used not only to accommodate the gold wire 235, but also to accommodate protection glue 237 for the gold wire, and then conductivity of the gold wire 235 and performance of the fingerprint identification apparatus 230 are ensured. Moreover, the substrate 231 may also be fixed under the display screen 210 by the flexible circuit board 239 such that the fingerprint sensor chip 233 is fixed under the display screen 210.

With reference to FIG. 4, the fingerprint identification apparatus may further include gold wire protection glue 237 for encapsulating and protecting the gold wire 235. Optionally, an arc height or an encapsulation height of the gold wire 235 is less than a certain threshold. For example, the arc height or the encapsulation height of the gold wire is less than 150 μm. For example, the arc height or the encapsulation height of the gold wire may be more specifically less than 70 μm.

It should be noted that space for accommodating the gold wire 235 may also be used to accommodate the gold wire protection glue 237.

For example, as shown in FIG. 4, space for accommodating the gold wire protection glue 237 includes, but is not limited to, the gap formed between a side wall of the fingerprint sensor chip 233 and a side wall of the first groove 2311, the gap formed between the fingerprint sensor chip 233 and the support 236, and a gap formed between the fingerprint sensor chip 233 and the first foam layer 245.

With reference to FIG. 4, the fingerprint identification apparatus 230 may further include an optical path layer 234, and the optical path layer 234 is configured to transmit the fingerprint detecting signal returned by the reflection or scattering via the finger to the fingerprint sensor chip 233. The optical path layer 234 is disposed above the fingerprint sensor chip 233 and may be configured to achieve an optical path design, the optical path design of the fingerprint identification apparatus 230 may refer to the foregoing optical path design of the fingerprint identification module 140, and no further details are provided herein. Only the optical path design adopting a micro lens layer is selected as an exemplary description. As an optional embodiment, the optical path layer 234 includes a micro lens layer and a light blocking layer, the micro lens layer may have a micro lens array formed by a plurality of micro lenses, the light blocking layer has a plurality of micro holes and is disposed under the micro lens layer, the micro holes are in one-to-one correspondence with the micro lenses, and the optical sensing units of the optical sensing array 2331 are in one-to-one correspondence with the micro lenses. Optionally, the optical path layer may further include another optical film layer. Specifically, another optical film layer may be provided between the micro lens layer and the fingerprint sensor chip 233, for example, a dielectric layer or a passivation layer. Optionally, the optical path layer 234 may further include a filter, and the filter is disposed above the micro lens layer or disposed in an optical path between the micro lens layer and the sensor chip 233. Reference may be made to the foregoing content for details, and no further details are provided herein.

In the embodiment of the present application, the filter is used to reduce undesired ambient light in fingerprint sensing to improve optical sensing of received light by the fingerprint sensor chip 233. The filter may be specifically used to reject light at a specific wavelength, such as near infrared light and partial of red light. For example, human fingers absorb most of energy of light at a wavelength below 580 nm, if one or more optical filters or optical filtering layers are designed to reject light at a wavelength from 580 nm to infrared, undesired contributions to the optical detection in fingerprint sensing from the ambient light may be greatly reduced.

For example, the filter may include one or more optical filters, the one or more optical filters can be configured, for example, as bandpass filters to allow transmission of light emitted by an OLED screen while blocking other light components such as infrared light in the sunlight. This optical filtering could be effective in reducing background light caused by the sunlight when the under-screen fingerprint identification apparatus 230 is used outdoors. The one or more optical filters can be implemented as, for example, optical filter coatings formed on one or more continuous interfaces or may be implemented on one or more discrete interfaces. It should be understood that the filter may be fabricated on a surface of any optical film layer of the optical path layer 234 or in an optical path along reflected light formed by reflection via a finger to the fingerprint sensor chip 233, which is not specifically limited in this embodiment of the present application.

In addition, a light incident face of the filter may be provided with an optical inorganic coating film or an organic blackening coating such that reflectance of the light incident face of the filter is lower than a first threshold, for example, 1%, thereby ensuring that the fingerprint sensor chip 233 can receive sufficient light signals so as to improve a fingerprint identification effect.

In an example that the filter is fixed to an upper surface of the fingerprint sensor chip 233 by a fixing apparatus, the filter and the fingerprint sensor chip 233 may be fixed by means of dispensing in a non-photosensitive area of the fingerprint sensor chip 233, and there is a gap between the filter and a photosensitive area of the fingerprint sensor chip 233. Alternatively, a lower surface of the filter is fixed on the upper surface of the fingerprint sensor chip 233 by glue having a refractive index lower than a preset refractive index. For example, the preset refractive index includes, but is not limited to, 1.3.

It should be noted that when the filter is attached to the upper surface of the fingerprint sensor chip 233 by filling of an optical adhesive, if the thickness of the adhesive covering the upper surface of the fingerprint sensor chip 233 is uneven, the Newton ring phenomenon may occur, thereby affecting the fingerprint identification effect.

In comparison with the implementation manner in which the filter is fixed above the upper surface of the fingerprint sensor chip 233 by a fixing apparatus, when the filter is a coating film on the fingerprint sensor chip 233 or another optical film layer, a filter adopting a base material of blue glass or white glass is avoided, which may not only avoid the Newton ring phenomenon and improve the fingerprint identification effect, but also effectively reduce a thickness of the fingerprint identification apparatus 230.

With reference to FIG. 4, the fingerprint identification apparatus may further include an image processor 244, and the image processor 244 is electrically connected to the substrate 231. For example, the image processor is disposed above the flexible circuit board 239 and electrically connected to the substrate 231 through the flexible circuit board 239. For example, the image processor 244 may be a microprocessor (Microprogrammed Control Unit, MCU) for receiving a fingerprint detecting signal (for example, a fingerprint image) transmitted from the fingerprint sensor chip 233 through the flexible circuit board 239 and simply processing the fingerprint detecting signal.

With reference to FIG. 4, the fingerprint identification apparatus may further include at least one capacitor 243, and the at least one capacitor 243 is electrically connected to the substrate 231 and configured to optimize the fingerprint detecting signal acquired by the fingerprint sensor chip 233.

For example, the at least one capacitor 243 is disposed on the flexible circuit board 239 and electrically connected to the substrate 231 through the flexible circuit board 239, then electrically connected to the fingerprint sensor chip 233, and the at least one capacitor 243 may be configured to optimize the fingerprint detecting signal acquired by the fingerprint sensor chip 233. For example, the at least one capacitor 243 is configured to perform filtering processing on the fingerprint detecting signal acquired by the fingerprint sensor chip 233. The fingerprint sensor chip 233 may correspond to one or more capacitors. For example, each chip in the fingerprint sensor chip 233 corresponds to one or more capacitors.

With reference to FIG. 4, the fingerprint identification apparatus may further include a connector 242, and the connector 242 is electrically connected to the substrate 231. For example, the connector 242 may be electrically connected to the substrate 231 through the flexible circuit board 239. The connector 242 may be configured to connect an external apparatus or another component of the electronic device so as to realize communication with the external apparatus or another component of the electronic device. For example, the connector 242 may be configured to connect a processor of the electronic device so that the processor of the electronic device receives a fingerprint detecting signal processed by the image processor 244 and performs fingerprint identification based on the processed fingerprint detecting signal.

It should be understood that FIG. 4 is only an example of the present application and may not be understood as limitation to the present application For example, in some alternative embodiments, the fingerprint sensor chip 233 may be provided with a through silicon via (TSV) and/or a redistribution layer (RDL), and the TSV and/or RDL is used to guide pins of the fingerprint sensor chip 233 from the upper surface to the lower surface. The lower surface of the fingerprint sensor chip 233 may be provided with a wiring layer through the TSV and/or RDL. The wiring layer of the lower surface of the fingerprint sensor chip 233 may be electrically connected to a wiring layer in the first groove 2311 of the substrate 231 through the gold wire 235. In this case, an outer wall of the fingerprint sensor chip 233 may be attached to a side wall of the first groove 2311, and a gap for accommodating the gold wire 235 may be provided between the lower surface of the fingerprint sensor chip 233 and the bottom of the first groove 2311. Further, the fingerprint sensor chip 233 may be further provided with a protective layer on a surface of the wiring layer for protecting and insulating the fingerprint sensor chip 233.

It should be understood that the support 236 may be a support formed of a material having adhesive properties. For example, the support 236 may be a support formed of a double-sided adhesive tape, but the embodiment of the present application is not limited thereto. For example, the support 236 may also be a support formed of a material having no adhesive property. For example, the material of the support 236 includes, but is not limited to, metal, resin, a fiberglass composite plate or the like, and in this case, the support 236 needs to be fixed between the foam layer 245 and the substrate 231.

Figure 5:
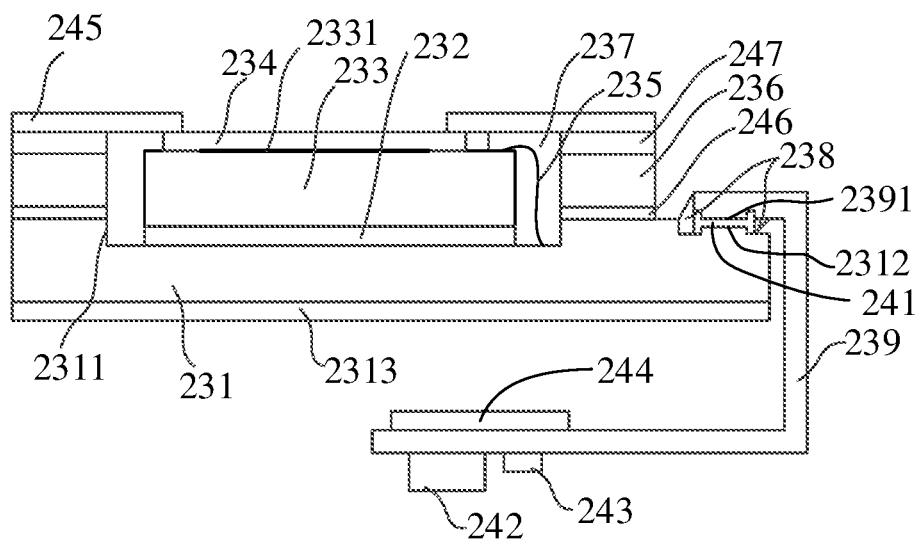

FIG. 5 is a deformation structure of the fingerprint identification apparatus shown in FIG. 4.

With reference to FIG. 5, the support 236 may be used as an independent component, that is, in addition to the support 236, the fingerprint identification 230 may include a double-sided adhesive tape 247 and support fixing glue 246, where a lower surface of the support 236 is connected to the upper surface of the substrate 231 by the support fixing glue 246, and an upper surface of the support 236 is connected to the first foam layer 245 by the double-sided adhesive tape 247. As an optional embodiment, the support 236 and the support fixing glue 246 may also be a one-piece structure, and the one-piece structure serves as a support. For example, the support may be a support formed of a single-sided adhesive tape for connecting the substrate 231, and an upper surface of the support is connected to the first foam layer 245 by the double-sided adhesive tape 247.

It should be understood that the gold finger 2391 of the flexible circuit board 239 may be located at one end of the flexible circuit board 239, but the embodiment of the present application is not limited thereto. For example, the gold finger 2391 of the flexible circuit board 239 is located at a middle position of the flexible circuit board 239, or the gold finger 2391 of the flexible circuit board 239 is close to a middle position of the flexible circuit board 239.

Figure 6:
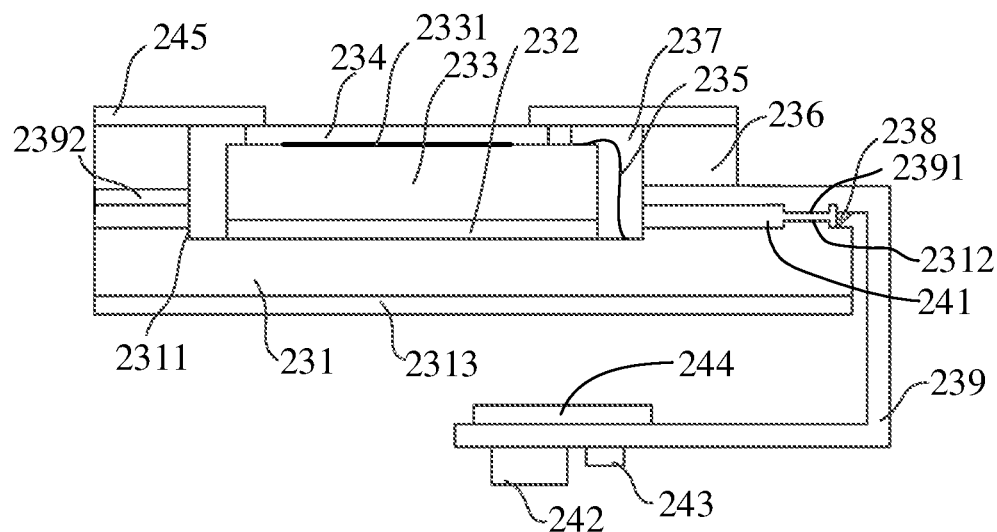

FIG. 6 is another deformation structure of the fingerprint identification apparatus shown in FIG. 4.

With reference to FIG. 6, the gold finger of the flexible circuit board 239 is located at a middle position of the flexible circuit board 239, one end of the flexible circuit board 239 is provided with an opening penetrating the flexible circuit board 239, and the opening of the flexible circuit board 239 is aligned with an opening of the first groove 2311 such that the fingerprint sensor chip 233 is disposed in the opening of the flexible circuit board 239. In other words, an opening is provided between one end 2392 of the flexible circuit board 239 and the gold finger 2391 of the flexible circuit board 239, and the opening of the flexible circuit board 239 is aligned with the opening of the first groove 2311 such that the fingerprint sensor chip 233 is disposed in the opening of the flexible circuit board 239.

In this case, in an area around the fingerprint sensor chip 233, the flexible circuit board 239 may be fixed above the substrate 231 by the anisotropic conductive film 241.

With reference to FIG. 6, a side wall of the flexible circuit board that is close to the fingerprint sensor chip 233 is aligned with a side wall of the first groove 2311 such that there is a gap between the flexible circuit board 239 and the fingerprint sensor chip 233 for accommodating a gold wire 235, and the gold wire 235 is used to electrically connect the fingerprint sensor chip 233 with the substrate 231.

The gap between the flexible circuit board 239 and the fingerprint sensor chip 233 can be used not only to accommodate the gold wire 235, but also to accommodate protection glue 237 for the gold wire, and then conductivity of the gold wire 235 and performance of the fingerprint identification apparatus 230 are ensured.

It should be understood that the substrate 231 and the flexible circuit board 239 may respectively have gold fingers such that the substrate 231 is electrically connected to the flexible circuit board 239 by means of compressing an anisotropic conductive film (ACF), but the embodiment of the present application is not limited thereto. For example, the substrate 231 and the flexible circuit board 239 may be integrally disposed, that is, the substrate 231 and the flexible circuit board 239 may serve as only two parts of one component.

Figure 7:
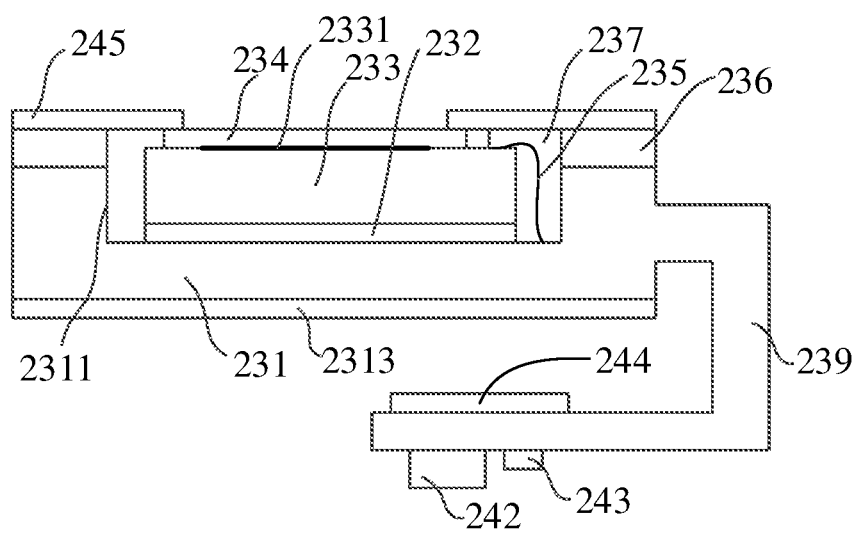

FIG. 7 is yet another deformation structure of the fingerprint identification apparatus shown in FIG. 4.

With reference to FIG. 7, the substrate 231 and the flexible circuit board 239 may serve as a rigid circuit board portion and a flexible circuit board portion of a rigid and flexible circuit board, that is, the first groove 2311 is disposed at the rigid circuit board portion of the rigid and flexible circuit board. In this case, an upper surface of the rigid circuit board portion may be fixedly connected to a lower surface of the first foam layer 245 by the support 236 (for example, a support formed of a double-sided adhesive tape).

It should be understood that FIGS. 4 to 7 are only examples of the present application and may not be understood as limitation to the present application For example, the preferred embodiments of the present application are described in detail above with reference to the accompanying drawings. However, the present application is not limited to specific details in the foregoing embodiments. Within the technical concept of the present application, a variety of simple variants may be carried out on the technical solution of the present application, and all of the simple variants are within the protection scope of the present application. For example, various specific technical features described in the foregoing specific embodiments may be combined in any suitable manner under the condition of no contradiction. In order to avoid unnecessary repetition, various possible combination ways will not be separately described in the present application. For another example, any combination may be made between various embodiments of the present application without departing from the idea of the present application, and it should also be regarded as the disclosure of the present application.

For example, the fingerprint identification apparatuses shown in FIG. 5 and FIG. 7 may be partially used in combination. For example, the flexible circuit board 239 and the substrate 231 in FIG. 5 may be replaced with the rigid and flexible circuit board of FIG. 7.

The present application further provides an electronic device, which includes a display screen and the fingerprint identification apparatus referred to above, the fingerprint identification apparatus is disposed under the display screen, and a fingerprint capturing area of fingerprint identification apparatus is at least partially located in a display area of the display screen.

With reference to FIG. 3, the electronic device 200 may include a middle frame 240. The middle frame 240 is used to support the display screen of the electronic device. An upper surface of the middle frame 240 extends downward to form a fourth groove, that is, the middle frame 240 is provided with a fourth groove, and the groove of the middle frame 240 is used to accommodate the fingerprint identification apparatus 230.

Further, the electronic device may further include a second foam layer 220. The second foam layer 220 is disposed under the display screen 210, the second foam layer 220 is provided with an opening window, the fingerprint identification apparatus 230 receives an optical signal emitted by the display screen 210 that is formed after being reflected via a human finger, and the optical signal is used for fingerprint identification.

There is a gap between a fingerprint sensor chip 233 in the fingerprint identification apparatus 230 and a lower surface of the display screen 210 (for example, a gap of the second foam layer 220). The gap may be an air gap that is not filled with any auxiliary material, which can ensure that the fingerprint sensor chip 233 will not be in contact with the lower surface of the display screen when the display screen is pressed or the electronic device is dropped or collided, and stability and performance of fingerprint identification for the fingerprint sensor chip 233 are not affected.

The display screen 210 may be an OLED organic light-emitting panel made using a low temperature poly-silicon (LTPS) technology, the display screen 210 is ultra-thin in thickness, light in weight and low in power consumption and may be used to provide clearer images.

The second foam layer 220 may also be used as a screen print layer or an embossed layer, the screen print layer may be provided with patterns and texts, and the patterns and texts may be used as a logo such as a trademark pattern. The second foam layer 220 may be a black sheet-like layer or a print layer for shielding light. In other embodiments, the second foam layer 220 may also be referred to as a cushion layer, a rear panel, or a heat dissipation layer.

In an example that the display screen is an OLED screen, the display screen may be a soft screen or a hard screen. When a finger is placed on a bright OLED screen, the finger will reflect light emitted from the OLED screen, and the reflected light will penetrate through the OLED screen until reaching an area under the OLED screen. An optical path layer located under the OLED screen can be used to filter out an infrared signal component in leaking light. Since a fingerprint is a diffuse reflector, an optical signal formed by reflection or diffusion via a finger may exist in all directions. Further, a micro lens array that may be disposed under the OLED screen and between the OLED screen and the fingerprint sensor chip can acquire an optical signal leaking from the OLED screen. Therefore, the fingerprint sensor chip 233 performs imaging of a fingerprint image by receiving an optical signal in which red light is filtered out.

It should be noted that the optical signal leaking from the OLED screen includes a fingerprint signal and an internal structure signal of the screen, and the in-screen structural signal may affect the imaging of the fingerprint image. For example, Moire fringes are generated when the imaging the fingerprint image is performed. In this embodiment, by controlling a thickness of a foam layer 220 and a thickness of each part, a distance between the fingerprint sensor chip 233 and the OLED screen (for example, the lower surface of the display screen 210) may be within a certain threshold (for example, 600 µm) such that the imaging of the screen structure is blurred, but the imaging of the structure of the fingerprint is not affected. The shorter the distance between the fingerprint sensor chip 233 and the OLED screen is, the better the fingerprint identification performance is; therefore, under a premise of permission of reliability and process capability, the distance between the fingerprint sensor chip 233 and the OLED screen may be shorten as far as possible.

It should be appreciated that specific examples in embodiments of the present application are just for helping those skilled in the art better understand the embodiments of the present application, rather than for limiting the scope of the present application.

It should also be appreciated that terms used in the embodiments of the present application and the claims appended hereto are merely for the purpose of describing particular embodiments, and are not intended to limit the embodiments of the present application. For example, the use of a singular form of "a", "the" and "said" in the embodiments of the present application and the claims appended hereto are also intended to include a plural form, unless otherwise clearly indicated herein by context.

Those of ordinary skill in the art may be aware that, elements of the examples described in the embodiments disclosed in the present application may be implemented by electronic hardware, computer software, or a combination of the two. To clearly illustrate interchangeability between the hardware and the software, the foregoing illustration has generally described composition and steps of the examples according to functions. Whether these functions are executed in hardware or software mode depends on a particular application and a design constraint condition of the technical solutions. A person skilled in the art may use different methods to implement the described functions for each particular application, but it should not be considered that the implementation goes beyond the scope of the present application.

In the several embodiments provided in the present application, it should be understood that, the disclosed system and apparatus may be implemented in other manners. For example, the described apparatus embodiment is merely an example. For example, the described apparatus embodiment is merely an example. For example, the element division is merely logical function division and may be other division in actual implementation. For example, a plurality of elements or components may be combined or integrated into another system, or some features may be ignored or not performed. In addition, the displayed or discussed mutual coupling or direct coupling or communication connection may be indirect coupling or communication connection through some interfaces, apparatuses or elements, and may also be electrical, mechanical, or connection in other forms.

The various functional elements referred to above may be integrally disposed, or each element may exist alone physically. The various functional elements may be implemented in a form of hardware, or may be implemented in a form of a software functional unit. If the integrated unit is implemented in the form of the software functional unit and is sold or used as an independent product, it may be stored in a computer readable storage medium. Based on such understanding, the nature of the technical solutions of the present application, or the part contributing to the prior art, or all of or part of the technical solutions may be implemented in a form of a software product. The computer software product is stored in a storage medium and includes several instructions for instructing a computer device (which may be a personal computer, a server, or a network device, and the like) to execute all of or part of the steps of the method described in the embodiments of the present application. The storage medium includes: various media that may store program codes, such as a U-disk, a removable hard disk, a read-only memory (ROM), a random access memory (RAM), a magnetic disk, a compact disk, and so on.

The foregoing descriptions are merely specific embodiments of the present disclosure. The protection scope of the present application, however, is not limited thereto. Any person who is skilled and familiar with the present technical field may readily conceive of various equivalent modifications or substitutions within the technical scope disclosed in the present application, and all of these modifications or substitutions shall fall within the protection scope of the present application. Therefore, the protection scope of the present application shall be subject to the protection scope of the claims.

What is claimed is:

1. A fingerprint identification apparatus, wherein the fingerprint identification apparatus is applicable to an electronic device having a display screen, and comprises:
   a fingerprint sensor chip;
   a substrate, wherein an upper surface of the substrate extends downward to form a first groove, and at least a portion of the fingerprint sensor chip is disposed in the first groove, and a size of the first groove is greater than a size of the fingerprint sensor chip such that there is a first gap between the fingerprint sensor chip and the first groove for accommodating a gold wire;
   a support disposed above the substrate around the fingerprint sensor chip, and there is a second gap between the support and the fingerprint sensor chip for accommodating the gold wire, the gold wire is used to electrically connect the fingerprint sensor chip with the substrate in the first groove; and a flexible circuit board disposed at a side of the first groove and outside the support, and the flexible circuit board is electrically connected to the substrate;

wherein the fingerprint sensor chip is disposed under the display screen through the substrate, and configured to receive a fingerprint detecting signal returned by reflection or scattering via a human finger on the display screen and detect fingerprint information of the finger based on the fingerprint detecting signal.

2. The fingerprint identification apparatus according to claim 1, wherein the fingerprint identification apparatus further comprises:

an optical path layer disposed above the fingerprint sensor chip and configured to transmit the fingerprint detecting signal returned by the reflection or scattering via the finger to the fingerprint sensor chip, wherein the optical path layer comprises:

a micro lens layer, the micro lens layer has a micro lens array formed by a plurality of micro lenses;

a light blocking layer, the light blocking layer has a plurality of micro holes and is disposed under the micro lens layer.

3. The fingerprint identification apparatus according to claim 2, wherein the micro holes are in one-to-one correspondence with the micro lenses.

4. The fingerprint identification apparatus according to claim 2, wherein the optical path layer further comprises:

a filter disposed above the micro lens layer or disposed in an optical path between the micro lens layer and the fingerprint sensor chip.

5. The fingerprint identification apparatus according to claim 4, wherein the filter is a coating film on the fingerprint sensor chip; or the filter and fingerprint sensor chip is fixed by means of dispensing in a non-photosensitive area of the fingerprint sensor chip, and there is a gap between the filter and a photosensitive area of the fingerprint sensor chip.

6. The fingerprint identification apparatus according to claim 4, wherein the fingerprint identification apparatus further comprises:

a first foam layer disposed above the support and provided with an opening penetrating the first foam layer, wherein the fingerprint sensor chip receives the fingerprint detecting signal returned by the reflection or scattering via the finger through the opening of the first foam layer.

7. The fingerprint identification apparatus according to claim 6, wherein an upper surface of the support is connected to the first foam layer by a double-sided adhesive tape.

8. The fingerprint identification apparatus according to claim 1, wherein a lower surface of the support is connected to the upper surface of the substrate by support fixing glue.

9. The fingerprint identification apparatus according to claim 8, wherein the support and the support fixing glue is a one-piece structure.

10. The fingerprint identification apparatus according to claim 1, wherein the support is a support formed of a double-sided adhesive tape, a lower surface of the support is connected to the substrate.

11. The fingerprint identification apparatus according to claim 1, wherein the fingerprint identification apparatus further comprises:

gold wire protection glue for encapsulating and protecting the gold wire, an arc height or an encapsulation height of the gold wire is less than 150 μm.

12. The fingerprint identification apparatus according to claim 1, wherein a depth of the first groove comprises a thickness of a covering film of the substrate and a thickness of a conducting layer located under the covering film.

13. The fingerprint identification apparatus according to claim 1, wherein on one side of the fingerprint sensor chip, the first gap is between a side wall of the fingerprint sensor chip and a side wall of the first groove, and the second gap is between a side wall of the fingerprint sensor chip and a side wall of the support that is close to the fingerprint sensor chip, wherein the side wall of the support that is close to the fingerprint sensor chip is aligned with the side wall of the first groove.

14. The fingerprint identification apparatus according to claim 1, wherein the flexible circuit board provided with a gold finger of the flexible circuit board, the upper surface of the substrate is provided with a gold finger of the substrate that is formed on the side where the flexible circuit board located in, wherein the gold finger of the flexible circuit board is electrically connected to the gold finger of the substrate by an anisotropic conductive film.

15. An electronic device, comprising:

a display screen;

a second foam layer disposed under the display screen; and a fingerprint identification apparatus disposed under the display screen, the fingerprint identification apparatus comprises:

a fingerprint sensor chip;

a substrate, wherein an upper surface of the substrate extends downward to form a first groove, and at least a portion of the fingerprint sensor chip is disposed in the first groove, and a size of the first groove is greater than a size of the fingerprint sensor chip such that there is a first gap between the fingerprint sensor chip and the first groove for accommodating a gold wire;

a support disposed above the substrate around the fingerprint sensor chip, and there is a second gap between the support and the fingerprint sensor chip for accommodating the gold wire, the gold wire is used to electrically connect the fingerprint sensor chip with the substrate in the first groove; and a flexible circuit board disposed at a side of the first groove and outside the support, and the flexible circuit board is electrically connected to the substrate;

wherein the fingerprint sensor chip is disposed under the display screen through the substrate, and configured to receive a fingerprint detecting signal returned by reflection or scattering via a human finger on the display screen and detect fingerprint information of the finger based on the fingerprint detecting signal;

wherein the second foam layer is provided with an opening penetrating the second foam layer, and the fingerprint identification apparatus is disposed under the second foam layer and receives the fingerprint detecting signal through the opening of the second foam layer.

16. The electronic device according to claim 15, wherein the electronic device further comprises:

a middle frame is provided with a fourth groove, and at least a portion of the fingerprint identification apparatus is disposed in the fourth groove.

\* \* \* \* \*